(12) United States Patent
Petit et al.

(10) Patent No.: US 8,421,559 B2
(45) Date of Patent: Apr. 16, 2013

(54) INTERFACE ACOUSTIC WAVE DEVICE

(75) Inventors: Roger Petit, Guichen (FR); Sylvain Ballandras, Besancon (FR); Emilie Courjon, Besancon (FR); Dorian Gachon, Besancon (FR)

(73) Assignees: Etat Francais Represente par le Delegue General pour l'Armement, Arcueil (FR); Centre Nationale de Recherche Scientifique, Paris (FR); Université de Franche Comte, Besancon (FR)

( * ) Notice: Subject to any disclaimer, the term of this patent is extended or adjusted under 35 U.S.C. 154(b) by 272 days.

(21) Appl. No.: 12/995,362

(22) PCT Filed: Sep. 17, 2009

(86) PCT No.: PCT/FR2009/001103
§ 371 (c)(1),
(2), (4) Date: Feb. 14, 2011

(87) PCT Pub. No.: WO2010/031924
PCT Pub. Date: Mar. 25, 2010

(65) Prior Publication Data
US 2011/0133857 A1     Jun. 9, 2011

(30) Foreign Application Priority Data
Sep. 18, 2008 (FR) ..................................... 08 05124

(51) Int. Cl.
*H03H 9/15* (2006.01)
*H03H 9/54* (2006.01)

(52) U.S. Cl.
USPC ........... 333/193; 333/150; 333/195; 310/311; 310/359

(58) Field of Classification Search .................. 333/150, 333/153, 193–196; 310/311, 313 R, 313 B, 310/313 D, 313 A, 357–359
See application file for complete search history.

(56) References Cited

U.S. PATENT DOCUMENTS

| 4,129,799 | A | 12/1978 | Green | |
| 8,344,588 | B2 * | 1/2013 | Ostrovskii et al. | 310/311 |
| 2002/0135270 | A1 * | 9/2002 | Ballandras et al. | 310/313 R |
| 2004/0192040 | A1 | 9/2004 | Peng et al. | |

FOREIGN PATENT DOCUMENTS

FR    2 811 828 A1    1/2002

OTHER PUBLICATIONS

Courjon E. et al., "Periodically Poled Transducsers Built on Single Crystal Lithium Niobate Layers Bonded onto Silicon," 2007 IEEE Ultrasonics Symposium, pp. 268-271.

(Continued)

*Primary Examiner* — Barbara Summons
(74) *Attorney, Agent, or Firm* — Oliff Berridge, PLC

(57) ABSTRACT

The present invention relates to the field of acoustic wave devices, and particularly to that of transducers capable of operating at very high frequencies, from a few hundred MHz to several gigahertz, and its subject is more particularly an interface acoustic wave device including at least two substrates and a layer of ferroelectric material, the latter being contained between a first electrode and a second electrode and having first positive-polarization domains and second negative-polarization domains, the first and second domains being alternated, wherein the assembly constituted by the first electrode, the layer of ferroelectric material, and the second electrode is contained between a first substrate and a second substrate.

10 Claims, 2 Drawing Sheets

OTHER PUBLICATIONS

Daniau W et al., "A Novel Piezoelectric Interdigital Transducer for the Excitation of High Frequency Surface Acoustic Waves," 2004 IEEE International Ultrasonics, Ferroelectrics, and Frequency Control Joint 50$^{th}$ Anniversary Conference, pp. 441-444.

Partial Translation of Written Opinion in International Application No. PCT/FR2009/001103, based on International Search Report mailed Jan. 4, 2010.

* cited by examiner

INTERFACE ACOUSTIC WAVE DEVICE

This application is the U.S. National Phase of PCT/FR2009/001103, filed Sep. 17, 2009, which claims priority from French Patent Application No. 0805124, filed Sep. 18, 2008, the entire disclosure of which is incorporated herein by reference hereto.

BACKGROUND

The present invention relates to the field of acoustic wave devices, and particularly to that of transducers capable of operating at very high frequencies, from a few hundred MHz to several gigahertz.

A number of patent applications are known that describe passive devices for processing RF signals, which comprise comb structures having interdigitated electrodes and apply the mechanism known as "interface waves." This type of device requires utilization of a polymer film that ensures an elastic connection between the materials; this produces considerable acoustic losses. Although certain configurations allow this type of organic layer to be omitted, they nevertheless require the development of technologies that allow integration with the interface of said interdigitated transducer, which is known to present technological difficulties.

Also known are narrow-gap transducers comprising electrodes of optimized width, in which the distance between electrodes is greatly reduced. In order to operate e.g. at 1.6 GHz, however, the electrodes having a width of 1.5 µm (or $\lambda/2$) must be separated by a distance on the order of a few hundredths of angstroms, requiring technology that is tricky to implement.

To eliminate these disadvantages, Patent Application FR 2811828 is known; this describes a surface acoustic wave device comprising a layer of ferroelectric material and a substrate, and characterized in that the layer of ferroelectric material is contained between a first electrode and a second electrode, and that the layer of ferroelectric material has first positive-polarization domains and second negative-polarization domains, the first and second domains being alternated.

SUMMARY

This type of device nevertheless has major disadvantages, namely:
- the need to thin a membrane down to very small thicknesses (on the order of the acoustic wavelength), making handling of the object very tricky and generally incompatible with industrial manufacturing procedures,
- considerable sensitivity to external influences requires vacuum encapsulation for proper operation,
- very high mode density, despite the possibility of reducing said density by making the transducer thinner (with the difficulties indicated above), which is generally not favorable for the manufacture of devices with high spectral purity,
- severe temperature drift in the resonant frequency of components using this principle, due to the fact that the ferroelectric materials presently used for this purpose (PZT, lithium niobate, lithium tantalite) have elastic properties that are highly sensitive to thermal effects.

The object of the invention is to eliminate the aforesaid disadvantages by proposing an acoustic wave device that allows operation at greater than GHz frequencies without implementation difficulties, that is highly insensitive to external effects, and that on the other hand allows very high quality coefficients to be obtained.

What is provided in order to achieve this is an interface acoustic wave device comprising at least two substrates and a layer of ferroelectric material, the latter being contained between a first electrode and a second electrode and having first positive-polarization domains and second negative-polarization domains, the first and second domains being alternated, said device being characterized in that the assembly constituted by the first electrode, the layer of ferroelectric material, and the second electrode is contained between a first substrate and a second substrate.

According to a particular characteristic, the layer of ferroelectric material comprises a first part having first positive-polarization domains and second negative-polarization domains, the first and second domains being alternated, and a second uniformly polarized part.

According to a particular characteristic allowing energy transfer zones to be constituted, a device according to the present invention comprises at least one cavity at the level of the layer of ferroelectric material and/or of at least one of the substrates.

According to an additional characteristic, a device according to the present invention has at least one of the following characteristics:
- a first part having first positive-polarization domains and second negative-polarization domains, the first and second domains being alternated, and a second uniformly polarized part, wherein the surfaces of at least one cavity constitute boundaries with said first and second parts and are orthogonal thereto,
- at least one of the substrates comprises at least one groove on its surface in contact with the electrode, said groove constituting a cavity,
- a first part having first positive-polarization domains and second negative-polarization domains, the first and second domains being alternated, and a second uniformly polarized part, wherein the second part comprises a third part not covered by the electrodes and thinned so as to form cavities between said third part and each of the first and second substrates, resulting in a break in acoustic impedance conducive to reflection of the waves, and confinement of them in the vicinity of the transducer,
- a first part having first positive-polarization domains and second negative-polarization domains, the first and second domains being alternated, and a second part made up of first or second domains separated by cavities.

The invention also relates to a resonator comprising at least one device according to the present invention.

BRIEF DESCRIPTION OF DRAWINGS

Other advantages and characteristics will emerge from the description of an embodiment of the invention with reference to the attached Figures, in which.

DETAILED DESCRIPTION OF EMBODIMENTS

Figure 1:
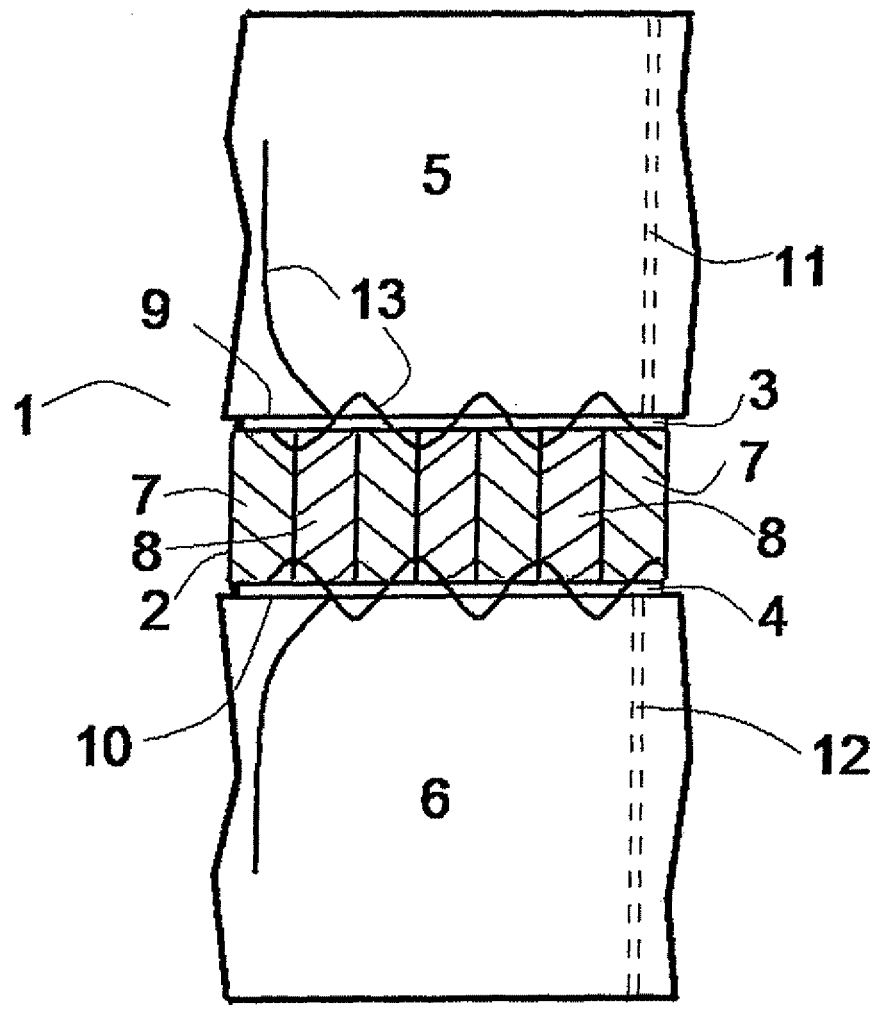
FIG. 1 is a general diagram of an interface wave device according to a particular embodiment of the invention.

FIG. 1 is a diagram of an interface acoustic wave device according to a first variant embodiment of the invention. This interface acoustic wave device 1 contains a layer 2 of ferroelectric material contained between a first electrode 3 and a second electrode 4, the assembly constituted by first electrode 3, layer 2 of ferroelectric material, and second electrode 4, being in turn contained between a first substrate 5 and a second substrate 6. Layer 2 of ferroelectric material comprises first positive-polarization domains 7 and second negative-polarization domains 8, the first and second domains being alternated.

In this exemplifying embodiment, layer 2 of ferroelectric material is made of lithium niobate, while the first and second electrodes are made of gold deposited onto layer 2 of ferroelectric material by cathodic vapor deposition or sputtering under vacuum. The first and the second substrate are made of silicon, and are bonded respectively onto exposed surfaces 9, 10 of first and second electrodes 3, 4 by metallic compression.

First and second vias 11, 12 are recessed respectively into first and second substrates 7, 8 to allow installation of electrical contacts.

Also depicted in this first Figure is the profile of a wave 13 of wavelength λ within device 1. This wave propagates practically losslessly at the level of the interfaces between said assembly and each of the substrates, while within each of the substrates the wave decreases exponentially (evanescent wave).

The manufacture of a layer 2 of ferroelectric material of this kind is known to the person skilled in the art and is set forth in particular in Patent Application FR 2811828.

The manufacture of a layer 2 of ferroelectric material of this kind is known to the skilled artisan, and is set forth in particular in Patent Application FR 2811828.

For applications in the field of transducers, it is thus possible to create structures having a domain inversion with a pitch on the order of a few hundred nanometers, i.e. entirely suitable for high-frequency applications. According to the present invention, the pitch of the network is on the order of the acoustic wavelength. The frequency is obtained, to a first approximation, by dividing the phase velocity of the wave by the network pitch, the latter corresponding to a ferroelectric polarization alternation (top/down) and being equal to the acoustic wavelength λ.

By covering the layer of ferroelectric material with a second electrode, it is thus possible to excite the resulting structure in dynamic fashion.

The alternation of positive-polarization and negative-polarization domains causes alternating extensions and compressions of matter at the level of the layer of ferroelectric material, thereby generating constructive acoustic interferences that propagate preferentially in the plane of the layer (which thus has a guidance function) rather than in the bulk. This is because the propagation velocity of elastic waves guided in the layer is lower than the propagation velocity of elastic waves in the substrate. It is, however, also possible to excite waves that exhibit complex polarizations (blending elliptical and shear displacements), or even waves with predominantly longitudinal polarization. It is thus possible, using substrates that have high elastic wave velocities (sapphire, silicon carbide, carbon/diamond, etc.), to trap in the ferroelectric layer waves of this kind that have propagation velocities equal to those of the corresponding bulk waves. The use of a material in which elastic waves propagate less quickly than in lithium niobate (typically lithium tantalate) also allows such waves to be guided using silicon or lithium niobate, for example, as upper and lower substrates. Quartz can also be used as a substrate with a lithium tantalate transducer, by judiciously selecting the cut angles of the material in order to promote the desired guidance effect. One example of a favorable quartz cut corresponds to the (YXt)/90° cut in the notation conforming to IEEE Standard 176, revision 1949 (IEEE Standard on Piezoelectricity Std 176-1949, Proc, of the IRE, Vol. 37, pp. 1378-1395, 1949), with which the Rayleigh waves (not coupled by piezoelectricity) propagate at 3800 m·s$^{-1}$ and the acoustic radiation in the bulk material proves to have a phase velocity of more than 4100 m·s$^{-1}$, i.e. considerably higher than the velocity of elliptically polarized waves in transducers having alternated ferroelectric domains.

It is thus possible to define at the surface of the substrate a single transducer that has a well-defined characteristic admittance, used in combination with other transducers of the same type (but having a different center frequency), so as to create network, ladder, or lattice filters or in fact to define an input transducer and an output transducer.

In accordance with the inventive concept, it is possible to produce, very directly, transduction functions that allow the development of transducers having particular specifications.

The period of domains 7, 8 is thus equivalent to the period between electrodes of the same polarity within interdigitated structures of the existing art. For the same feature width (used to produce interdigitated transducer electrodes or to define the width of an alternating-polarization transducer domain), the present invention allows an increase in operating frequency by a factor of almost 2, as already mentioned in Patent Application FR2811828.

It is possible in particular to influence the directionality of the surface acoustic waves by creating neutral-polarization elements that modify the phase of the waves by locally disrupting the pitch of the alternated domains. Wave propagation is then disrupted asymmetrically, favoring one direction rather than the other.

It is likewise possible to produce, in a more simple fashion than in the existing art, surface wave devices having filtering functions that are highly wavelength-selective. Specifically, covering the electrodes allows the shape of the transducer's pulse response to be defined. This approach, known in the field of interdigitated combs as "transducer apodization," is highly limiting in terms of technical realization. In the present case, this functionality is achieved using solid (not distributed) electrodes, thereby considerably simplifying implementation of the technique.

In addition, a resonator can be constituted, for example, using two devices 1 according to this first embodiment of the invention, separated by an energy transfer zone whose dimensions are optimized in known fashion in order to optimize wave trapping.

FIGS. 2 to 5 each depict an embodiment of a resonator, comprising a reflective structure intended to implement a Bragg mirror for interface waves excited by a transducer, utilizing an interface wave device according to the present invention.

Figure 2:
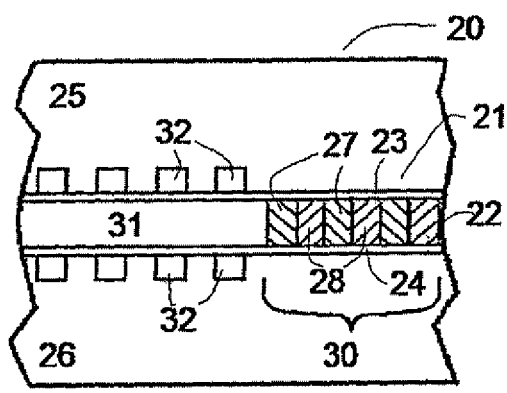
FIG. 2 is a diagram of a first variant embodiment of a resonator utilizing an interface wave device according to the present invention.

In the context of FIG. 2, resonator 20 comprises an interface acoustic wave device 21 containing a layer 22 of ferroelectric material contained between a first electrode 23 and a second electrode 24, the assembly constituted by first electrode 23, layer 22 of ferroelectric material, and second electrode 24 being in turn contained between a first substrate 25 and a second substrate 26. Layer 22 of ferroelectric material comprises a first part 30 having first positive-polarization domains 27 and second negative-polarization domains 28, the first and second domains being alternated, and a second uniformly polarized part 31. At the level of said second part 31, each of the first and second substrates 25, 26 comprises grooves 32 on its surface in contact with the corresponding electrode. These grooves are produced by etching.

The function of these grooves is to constitute energy transfer zones (wave diffraction with phase reflection toward the emitting transducer).

Figure 3:
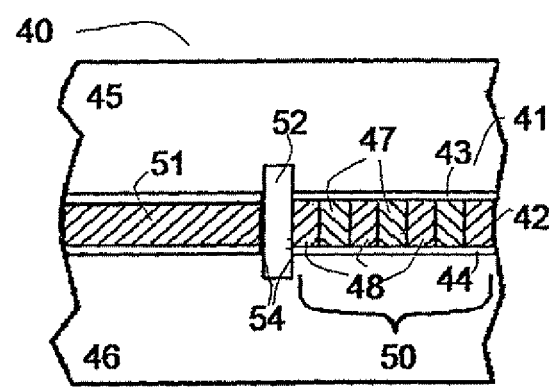
FIG. 3 is a diagram of a second variant embodiment of a resonator utilizing an interface wave device according to the present invention.

In the context of FIG. 3, resonator 40 comprises an interface acoustic wave device 41 containing a layer 42 of ferroelectric material contained between a first electrode 43 and a second electrode 44, the assembly constituted by first electrode 43, layer 42 of ferroelectric material, and second electrode 44 being in turn contained between a first substrate 45 and a second substrate 46. Layer 42 of ferroelectric material comprises a first part 50 having first positive-polarization domains 47 and second negative-polarization domains 48, the first and second domains being alternated, and a second uniformly polarized part 51. A cavity 52 separates first and second parts 50, 51. Said cavity has a rectangular section whose height is greater than that of said assembly, so that each of the substrates comprises a part of it. It comprises two surfaces 54 that constitute boundaries with said first and second parts and are orthogonal thereto. Said surfaces 54 are thus orthogonal to the propagation direction of waves within the device. The function of this cavity is to constitute energy transfer zones. This type of resonator also, by application of a potential difference to the electrodes, allows the frequency of the device to be adjusted by creating a static electric field in the layer of ferroelectric material. Since the sign of the dielectric constants is not affected by the ferroelectric polarization, but the amplitude of said constants can be modified by applying a static electric field, it is possible to use this phenomenon to change the propagation velocity of the waves and consequently the resonant frequency of the device.

Figure 4:
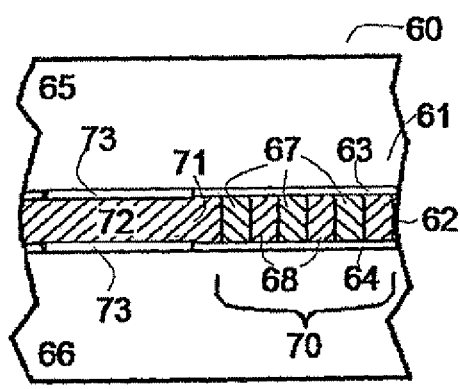
FIG. 4 is a diagram of a third variant embodiment of a resonator utilizing an interface wave device according to the present invention.

In the context of FIG. 4, resonator 60 comprises an interface acoustic wave device 61 containing a layer 62 of ferroelectric material contained between a first electrode 63 and a second electrode 64, the assembly constituted by first electrode 63, layer 62 of ferroelectric material, and second electrode 64 being in turn contained between a first substrate 65 and a second substrate 66. Layer 62 of ferroelectric material comprises a first part 70 having first positive-polarization domains 67 and second negative-polarization domains 68, the first and second domains being alternated, and a second uniformly polarized part 71, and a third uniformly polarized part 72 that is placed between said first and second parts, is not covered by the electrodes, and is thinned so as to form cavities 73 between said third part and each of the first and second substrates. The function of these cavities is to constitute energy transfer zones.

Figure 5:
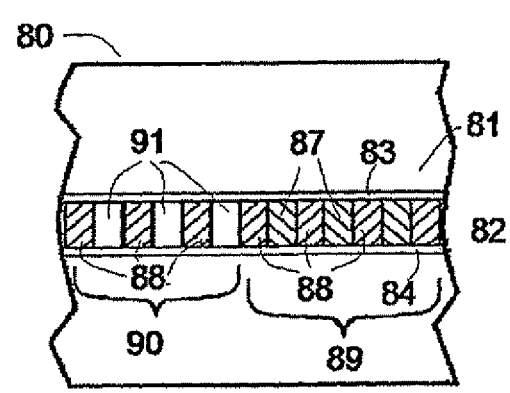
FIG. 5 is a diagram of a fourth variant embodiment of a resonator utilizing an interface wave device according to the present invention.

In the context of FIG. 5, resonator 80 comprises an interface acoustic wave device 81 containing a layer 82 of ferroelectric material contained between a first electrode 83 and a second electrode 84, the assembly constituted by first electrode 83, layer 82 of ferroelectric material, and second electrode 84 being in turn contained between a first substrate 85 and a second substrate 86. Layer 82 of ferroelectric material comprises a first part 89 having first positive-polarization domains 87 and second negative-polarization domains 88, the first and second domains being alternated, and a second part 90 comprising negative-polarization domains 88 separated by cavities 91. Here as well, the function of these cavities is to constitute energy transfer zones.

The resonators according to the present invention are of high quality, protected from outside attack by the presence of substrates on either side of said assembly and operating, for the same lithographic resolution, at a frequency twice that of a conventional interdigitated comb transducer.

Numerous modifications can moreover be made to the above-described methods without leaving the context of the invention. For example, a number of mono-, poly- or multicrystalline ferroelectric materials, such as lead oxide, zirconium titanate, lithium tantalate, lithium niobate, potassium niobate, PZT, $PbTiO_3$ (all ferroelectric ceramics, relaxers, and PMT-PT type ceramic crystals) can be used to create the transduction zone having alternated-polarization zones, with a preference for monocrystals or epitaxic materials in order to retain acoustic propagation quality, which is known to be linked to the quality of the crystal lattice.

The same applies to the substrate, which could be made, for example, by growing thick carbon-diamond films having thicknesses in particular between 20 and 100 μm, or films of silicon, sapphire, or silicon carbide, but also of quartz, the cuts being selected in terms of their surface wave guidance properties (cf. note above), of lithium niobate itself (with the same caution regarding selection of cuts in terms of surface propagation velocity), and more generally of any monocrystalline material having surface wave velocities that exceed those of waves of the same polarization in the transducer. Configurations also exist for which interface waves (essentially longitudinally polarized) can be guided above the radiation velocity in the substrates. Close attention must then be paid to the working points and to the ratio between transducer thickness and wavelength, in order to minimize radiation propagation losses in the substrates.

In addition, the electrodes can be made of any electrically conductive material.

The invention claimed is:

1. An interface acoustic wave device comprising at least two substrates and a layer of ferroelectric material, the latter being contained between a first electrode and a second electrode and having first positive-polarization domains and second negative-polarization domains, said first and second domains being alternated, wherein the assembly constituted by the first electrode, the layer of ferroelectric material, and the second electrode is contained between a first substrate and a second substrate.

2. The interface acoustic wave device according to claim 1, wherein the layer of ferroelectric material comprises a first part having first positive-polarization domains and second negative-polarization domains, the first and second domains being alternated, and a second uniformly polarized part.

3. The interface acoustic wave device according to claim 1, wherein the layer of ferroelectric material comprises at least one cavity.

4. The interface acoustic wave device according to claim 3 and comprising a first part having first positive-polarization domains and second negative-polarization domains, the first and second domains being alternated, and a second uniformly polarized part, wherein the surfaces of at least one cavity constitute boundaries with said first and second parts and are orthogonal thereto.

5. The interface acoustic wave device according to claim 3 and comprising a first part having first positive-polarization domains and second negative-polarization domains, the first and second domains being alternated, and a second part made up of first or second domains separated by cavities.

6. The interface acoustic wave device according to claim 3 and comprising a first part having first positive-polarization domains and second negative-polarization domains, the first and second domains being alternated, and a second uniformly polarized part, wherein the second part comprises a third part not covered by the electrodes and thinned so as to form cavities between said third part and each of the first and second substrates.

7. The interface acoustic wave device according to claim 1, wherein at least one of the substrates comprises at least one groove on its surface in contact with the electrode, said groove constituting a cavity.

8. A resonator comprising a one device according to claim 1.

9. A bandpass filter comprising a device according to claim 1.

10. A resonator, bandpass filter, or sensor comprising a device according to claim 1, tunable in frequency by application of a potential difference to the electrodes, creating a static field in the ferroelectric material.

* * * * *